United States Patent
Jang

(10) Patent No.: US 6,946,680 B2
(45) Date of Patent: Sep. 20, 2005

(54) LIQUID CRYSTAL DISPLAY DEVICE WITH SHORT-CIRCUIT PREVENTING STRUCTURE AND METHOD OF FABRICATING THE SAME

(75) Inventor: Hyong Wook Jang, Daegu-kwangyokshi (KR)

(73) Assignee: LG. Philips LCD Co., Ltd, Seoul (KR)

( * ) Notice: Subject to any disclaimer, the term of this patent is extended or adjusted under 35 U.S.C. 154(b) by 0 days.

(21) Appl. No.: 10/638,495

(22) Filed: Aug. 12, 2003

(65) Prior Publication Data

US 2004/0031991 A1 Feb. 19, 2004

(30) Foreign Application Priority Data

Aug. 17, 2002 (KR) .............................. 10-P2002-0048686

(51) Int. Cl.$^7$ .............................................. H01L 29/04
(52) U.S. Cl. ............................ 257/59; 438/72; 438/581
(58) Field of Search ........................... 257/581, 59, 72, 257/43

(56) References Cited

U.S. PATENT DOCUMENTS 6,674,495 B1 * 1/2004 Hong et al. .................... 349/43

* cited by examiner

*Primary Examiner*—Thanh Nguyen
(74) *Attorney, Agent, or Firm*—McKenna Long & Aldridge LLP

(57) ABSTRACT

A liquid crystal display device and a method of fabricating the same are disclosed in the present invention. The liquid crystal display device includes a gate line and a data line crossing each other on a substrate, a pixel electrode at an area defined by the gate line and the data line, a gate electrode connected to the gate line, a source electrode connected to the data line, a drain electrode connected to the pixel electrode, and a semiconductor layer acting as a channel between the source and drain electrode, wherein the data line and the semiconductor layer has a trench formed at a side facing to the drain electrode.

12 Claims, 15 Drawing Sheets

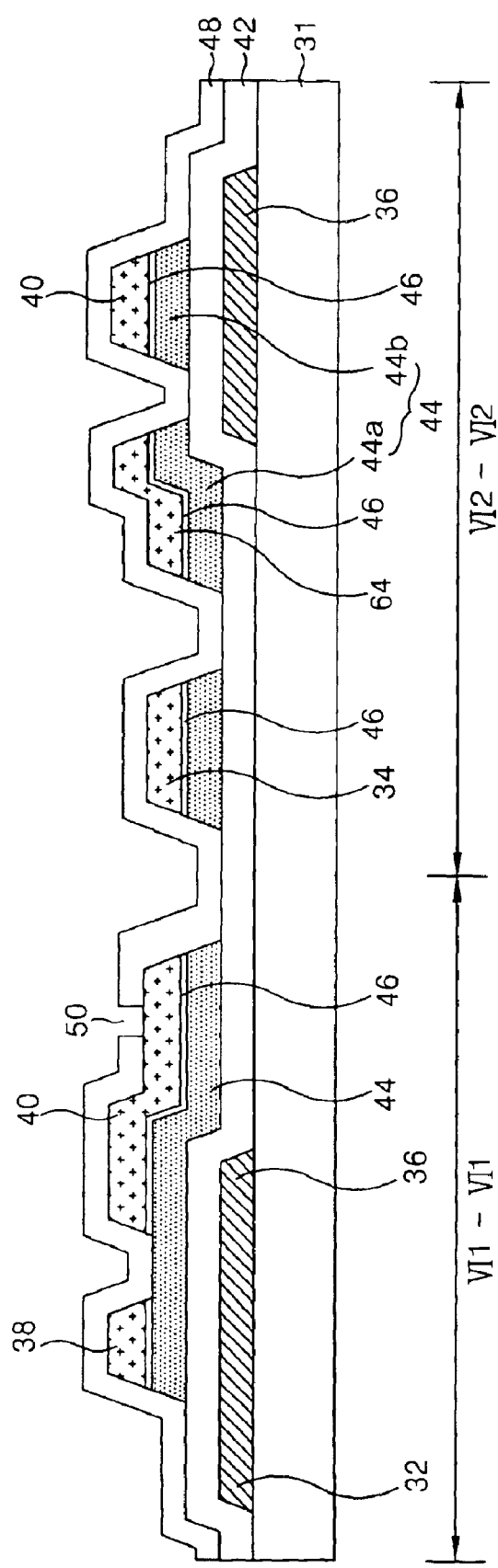

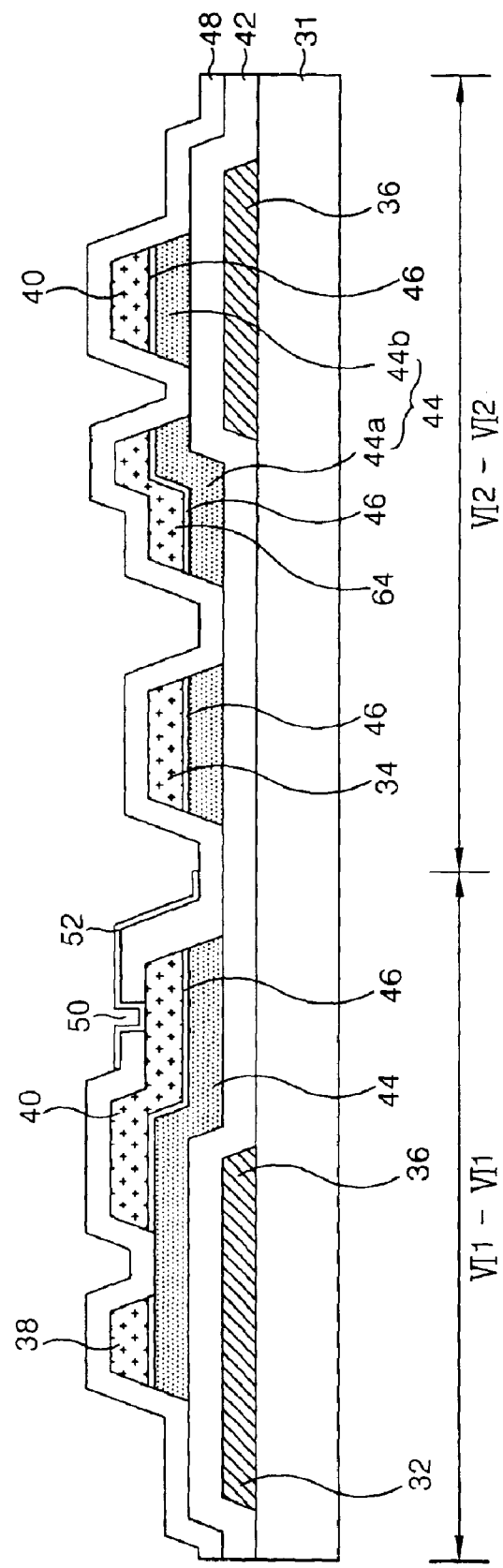

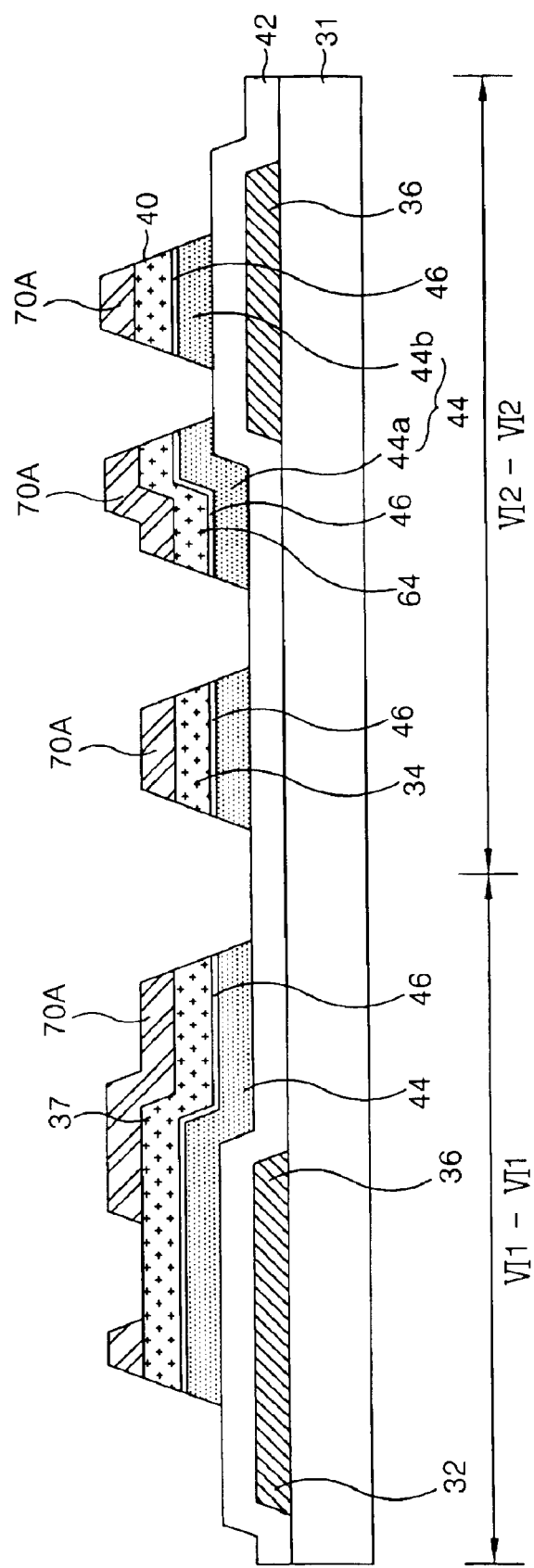

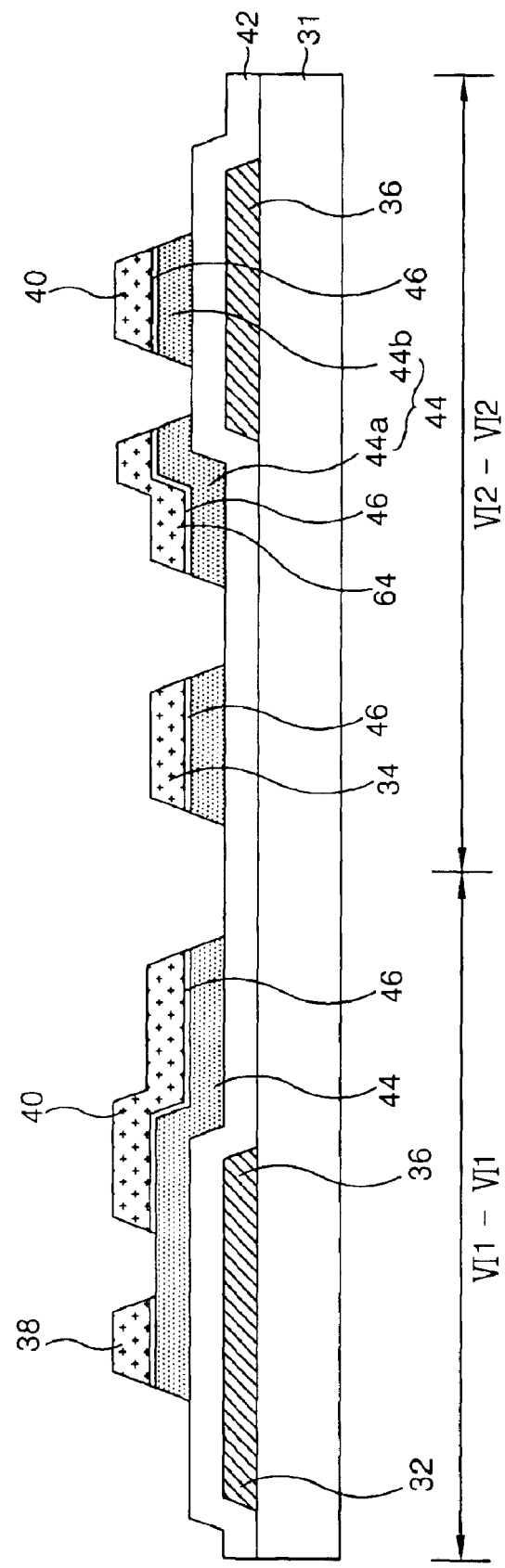

LIQUID CRYSTAL DISPLAY DEVICE WITH SHORT-CIRCUIT PREVENTING STRUCTURE AND METHOD OF FABRICATING THE SAME

This application claims the benefit of the Korean Patent Application No. P2002-048686 filed on Aug. 17, 2002, which is hereby incorporated by reference.

BACKGROUND OF THE INVENTION

1. Field of the Invention

The present invention relates to a liquid crystal display device, and more particularly, to a liquid crystal display device and a method of fabricating the same. Although the present invention is suitable for a wide scope of applications, it is particularly suitable for preventing short-circuits between semiconductor layers and between a data line and the gate line.

2. Discussion of the Related Art

Generally, liquid crystal display devices control the light transmittance of liquid crystals by using an electric field to display a picture. To this end, the liquid crystal display device includes a liquid crystal display panel with liquid crystal cells arranged in a matrix form, and a driving circuit to drive the liquid crystal display panel. Pixel electrodes and common electrodes are provided to apply an electric field to each of the liquid crystal cells. Normally, the pixel electrode is formed on a lower substrate by liquid crystal cells, whereas the common electrode is integrated into the entire surface of an upper substrate. Each pixel electrode is connected to a thin film transistor (hereinafter, referred to as a TFT) used as a switching device. The pixel electrode drives the liquid crystal cell along with the common electrode in accordance with data signals applied through the thin film transistor.

The lower substrate of the liquid crystal display device requires a plurality of mask processes as well as a semiconductor process, thus the fabricating process becomes complicated and acts as a major factor for increasing the fabricating cost of the liquid crystal display panel. Accordingly, the lower substrate has been developed in a direction of reducing the number of mask processes. This is because one mask process includes several processes such as a deposition process, a cleaning process, a photolithography process, an etching process, an exfoliation process, and a testing process. Accordingly, a four-mask process has recently been on the rise, wherein one of the process steps from a five-mask process has been omitted.

FIGS. 1 and 2 are a plane view and a cross-sectional view illustrating a lower substrate formed by a four-mask process.

Referring to both FIGS. 1 and 2, a lower substrate 1 of the liquid crystal display device includes a TFT 30 located at each intersection of a plurality of data lines 4 and gate lines 2, and a pixel electrode 22 connected to the drain electrode 10 of the TFT 30.

The TFT 30 includes a gate electrode 6 connected to the gate line 2, a source electrode 8 connected to the data line 4, and a drain electrode 10 connected to the pixel electrode 22 through a drain contact hole 20.

The gate electrode 6 overlaps a portion of the data line 4. The drain electrode 10 has a neck part 10a where the drain electrode 10 overlaps the gate electrode 6, and a head part 10b where the drain electrode 10 overlaps the pixel electrode 22. The source electrode 8 is formed to face into the neck part 10a of the drain electrode 10 having a U-shaped channel therebetween.

The TFT 30 further includes semiconductor layers 14 and 16 to form a conductive channel between the source electrode 8 and the drain electrode 10 by applying a gate voltage to the gate electrode 6. The TFT 30 selectively supplies a data signal from the data line 4 to the pixel electrode 22 in response to a gate signal from the gate line 2.

The pixel electrode 22 is located at a cell area divided by the data line 4 and the gate line 2 and formed of a transparent conductive material having a high light transmittance. The pixel electrode 22 is formed on a protective layer 18 spread on the entire surface of the lower substrate 1, and is electrically connected to the drain electrode 10 through a drain contact hole 20 that penetrates the protective layer 18. A potential difference is generated between the pixel electrode 22 and a common transparent electrode (not shown) formed in the upper substrate (not shown) by the data signal supplied through the TFT 30. The potential difference causes the liquid crystals located between the lower substrate 1 and the upper substrate (not shown) to rotate due to the dielectric constant anisotropy. The rotating liquid crystals cause a light incident through the pixel electrode 22 from a light source to be transmitted to the upper substrate.

The method of fabricating the lower substrate of the liquid crystal display device will be described in conjunction with FIGS. 3A to 3D.

Referring to FIG. 3A, the gate electrode 6 and the gate line 2 are formed on the lower substrate 1.

To this end, a gate metal layer is deposited on the lower substrate 1 by a vapor deposition method, such as a sputtering method. The gate metal layer is formed of aluminum (Al) or aluminum alloy. The gate metal layer is patterned by a photolithography process and an etching process using a first mask to form a gate electrode 6 and the gate line 2 on the lower substrate 1.

Referring to FIG. 3B, a gate insulating layer 12, an active layer 14, an ohmic contact layer 16, a data line 4, a source electrode 8, and a drain electrode 10 are formed on the lower substrate having the gate electrode 6 and the gate line 2 formed thereon.

To this end, the gate insulating layer 12, first and second semiconductor layers, and a data line metal layer are sequentially deposited by a vapor deposition method, such as chemical vapor deposition (CVD) or sputtering, on the lower substrate 1 having the gate electrode 6 and the gate line 2. Herein, the gate insulating layer 12 is formed of an inorganic insulating material, such as silicon oxide (SiOx) or silicon nitride (SiNx), a first semiconductor layer is formed of undoped amorphous silicon, a second semiconductor layer is formed of doped amorphous silicon, and the data line metal layer is formed of molybdenum (Mo) or molybdenum alloy.

A photoresist pattern is formed on the data line metal layer by a photolithography process using a second mask. In this case, a half-tone mask with a semi-transmitting part at the channel part of the TFT is used as a second mask, thus the photoresist pattern corresponding to a channel part is lower in height than the photoresist pattern corresponding to a source/drain electrode.

The data line metal layer is patterned by a wet etching process using the photoresist pattern, whereby the data line 4, the source electrode 8, and the drain electrode 10 are formed.

Then, the first and second semiconductors are simultaneously patterned by a dry etching process using the same photoresist pattern to form an active layer 14 and an ohmic contact layer 16.

And, the photoresist pattern having a low height at the channel is removed by an ashing process, and the data line metal layer and the ohmic contact layer formed at the channel part are etched by the dry etching process using the remaining photoresist pattern. Accordingly, the active layer 14 of the channel part is exposed to separate the source electrode 8 from the drain electrode 10.

Then, the remaining photoresist pattern is removed from the source electrode 8 and the drain electrode 10 by a strip process.

Referring to FIG. 3C, a protective layer 18 with a drain contact hole 20 on the gate insulating layer 12 where the source electrode 8, the drain electrode 10 and the data line are formed. The protective layer 18 is formed of an inorganic insulating material, such as silicon nitride (SiNx) and silicon oxide (SiOx), or an organic insulating material, such as an acrylic organic compound, benzocyclobutene (BCB), and perfluorocyclobutane (PFCB). Subsequently, the protective layer 18 is patterned by a photolithography process and an etching process using a third mask to form the drain contact hole 20. The drain contact hole 20 is formed in the protective layer 18 to expose the drain electrode 10.

Referring to FIG. 3D, the pixel electrode 22 is formed on the protective layer 18. A transparent metal layer is formed on the lower substrate 1 where the protective layer 18 is formed by a vapor deposition method, such as a sputtering method. The transparent metal layer is formed of indium tin oxide (ITO), indium zinc oxide (IZO) or indium tin zinc oxide (ITZO). Subsequently, the transparent metal layer is patterned by a photolithography process and an etching process using a fourth mask to form the pixel electrode 22. The pixel electrode 22 is connected to the drain electrode 10 through the drain contact hole 20 that is formed in the protective layer 18.

In the liquid crystal display device, the data line metal layer and the semiconductor layer are patterned by the same mask to form the active layer 14, the ohmic contact layer 16, the data line 4, the source electrode 8, and the drain electrode 10. In this case, the channel part formed between the source and drain electrodes 8 and 10 are formed to overlap the gate electrode 6, thereby restraining an increase of an optical pumping current by the light incident from a backlight. However, there occasionally occurs a case that the optical pumping current increases within the active layer 14 formed at the end of the gate electrode 6, since the light incident from the backlight is not intercepted by the gate electrode 6. In order to resolve this problem, as shown at P1 area in FIG. 1, a trench is formed on the active layer 14 formed at the end of the gate electrode 6.

Nevertheless, a short-circuit is generated between active layers where the data line 4 and the drain electrode 10 are formed, so that the optical pumping current increases with the active layer.

More specifically, the data line 4 and the drain electrode 10 formed at the end of the projected parts of the gate electrode 6, as shown in FIG. 4, are formed with a specific gap d1 therebetween. The active layers 14a and 14b and the ohmic contact layer 16 formed at the lower part of the data line 4 and the drain electrode 10 are simultaneously formed with the same mask when forming the data line 4 and the drain electrode 10. In this case, the width of the active layers 14a and 14b is formed to be wider than that of the data line 4 and the drain electrode 10. Accordingly, the short circuit between the first and second active layers 14a and 14b often occurs by the pattern defect between the first active layer 14a formed at the lower part of the data line 4 and the second active layer 14b formed at the lower part of the drain electrode 10 in an area except the gate electrode. A bad channel formed between the data line 4 and the drain electrode 10 causes by short circuit is excited by the light incident from the backlight to increase the optical pumping current with the active layer 14. This is because charges existing in the active layer 14 react on the light to increase the optical pumping current. Thus, a voltage charged in the pixel electrode 22 is discharged to the data line 4 through the bad channel, thereby generating a brightness spot, since the voltage charged in the pixel electrode 22 becomes lower.

Further, as shown in FIG. 4, the distance between the data line 4 and the drain electrode is narrow, thus there often occurs a case that the data line 4 and the drain electrode 10 are shorted. In this case, the data signal may be applied to the pixel electrode 22 through the shorted data line 4 and the drain electrode 10 regardless of the gate signal.

SUMMARY OF THE INVENTION

Accordingly, the present invention is directed to a liquid crystal display device and a method of fabricating the same that substantially obviate one or more of problems due to limitations and disadvantages of the related art.

Another object of the present invention is to provide a liquid crystal display device and a method of fabricating the same for preventing a short-circuit between semiconductor layers.

Another object of the present invention is to provide a liquid crystal display device and a method of fabricating the same for preventing a short-circuit between a data line and a gate line.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device includes a gate line and a data line crossing each other on a substrate, a pixel electrode at an area defined by the gate line and the data line, a gate electrode connected to the gate line, a source electrode connected to the data line, a drain electrode connected to the pixel electrode, and a semiconductor layer acting as a channel between the source and drain electrode, wherein the data line and the semiconductor layer has a trench formed at a side facing to the drain electrode.

Herein, the data line is formed to at least partially overlap the gate electrode in a vertical direction, and the trench is formed at the overlapping area of the data line and the gate electrode.

The liquid crystal display device further includes a gate insulating layer formed on the gate electrode and the gate line, and a protective layer formed on the gate insulating layer.

Herein, the data line with the trench has a width of about 7 to 8 micrometers ($\mu$m), and the data line without the trench has a width of about 10 micrometers ($\mu$m).

Herein, the semiconductor layer includes an active layer formed over the gate electrode, and an ohmic contact layer formed on the active layer having the same pattern as the data line, the source electrode, and the drain electrode.

Herein, the source electrode is formed to project from the data line, and the drain electrode is formed to face into the source electrode having a U-shaped channel therebetween.

In another aspect of the present invention, a method of fabricating a liquid crystal display device includes forming a gate line and a gate electrode on a substrate by using a first mask, forming a semiconductor layer, a source electrode, a drain electrode, and a data line over the gate line and the gate electrode, wherein the data line is formed to have a trench at a side of the data line and the semiconductor facing to the drain electrode by using a second mask, forming a protective layer on the semiconductor layer, the source electrode, the drain electrode, and the data line by using a third mask, and forming a pixel electrode on the protective layer by using a fourth mask.

The data line is formed to at least partially overlap the gate electrode, and the trench is formed at an overlapping area of the data line and the gate electrode.

The source electrode is formed to project from the data line, and the drain electrode is formed to face the source electrode having a U-shaped channel therebetween.

In a further aspect of the present invention, a liquid crystal display device includes a substrate, a gate line and a gate electrode connected to each other on the substrate, a first insulating layer on the gate line and the gate electrode, a semiconductor layer over the gate line and the gate electrode, a data line and a drain electrode connected to each other on the semiconductor layer, wherein the data line and the semiconductor layer has a trench at a side facing into the drain electrode, and a second insulating layer on the data line and the drain electrode and in the trench, so that the first and second insulating layers are in a direct contact with each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIGS. 8A to 8D are cross-sectional views illustrating the process for fabricating the lower substrate of the liquid crystal display device shown in FIG. 6; and FIGS. 9A to 9D are cross-sectional views illustrating the second mask process shown in FIG. 8B.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
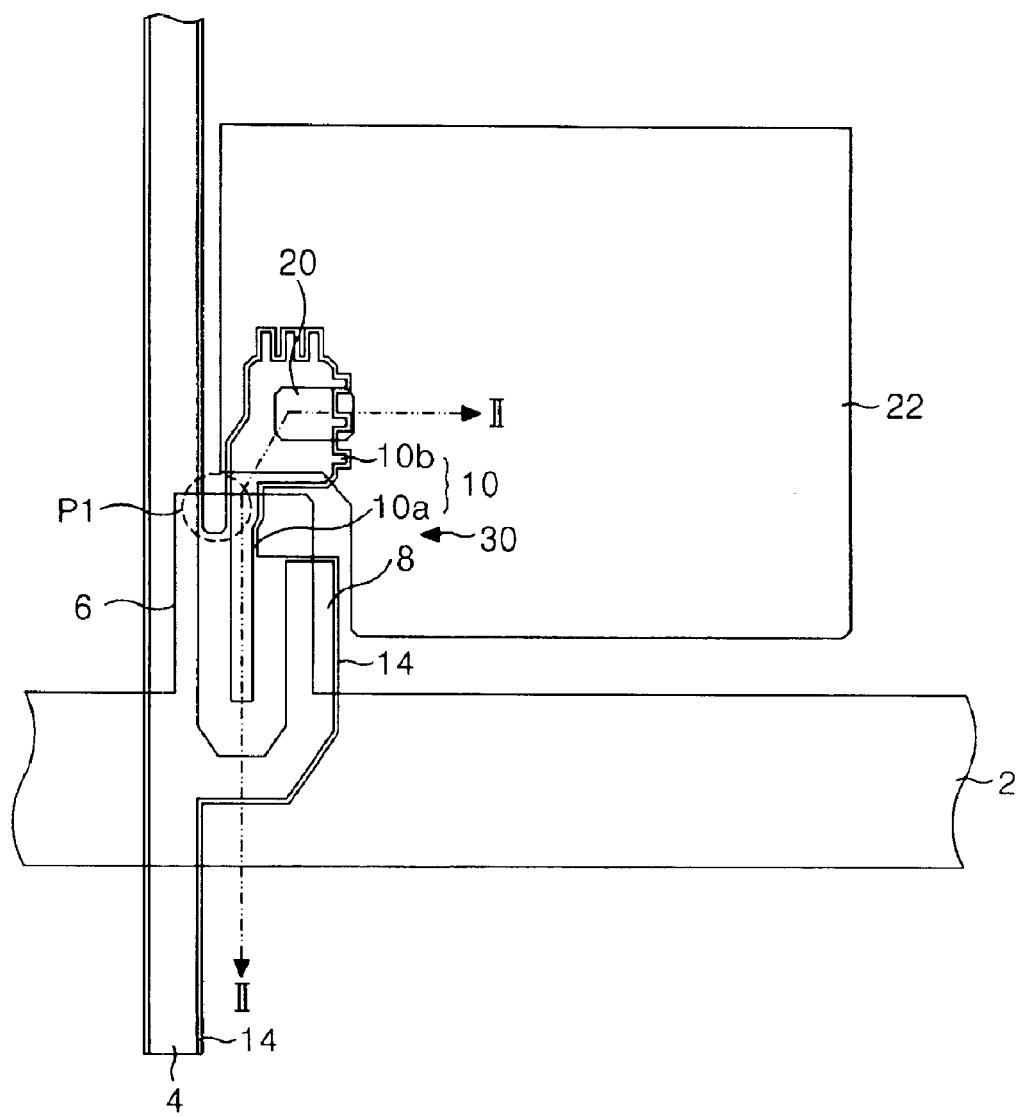
FIG. 1 is a plane view illustrating a lower substrate of a liquid crystal display device of the related art.
Figure 2:
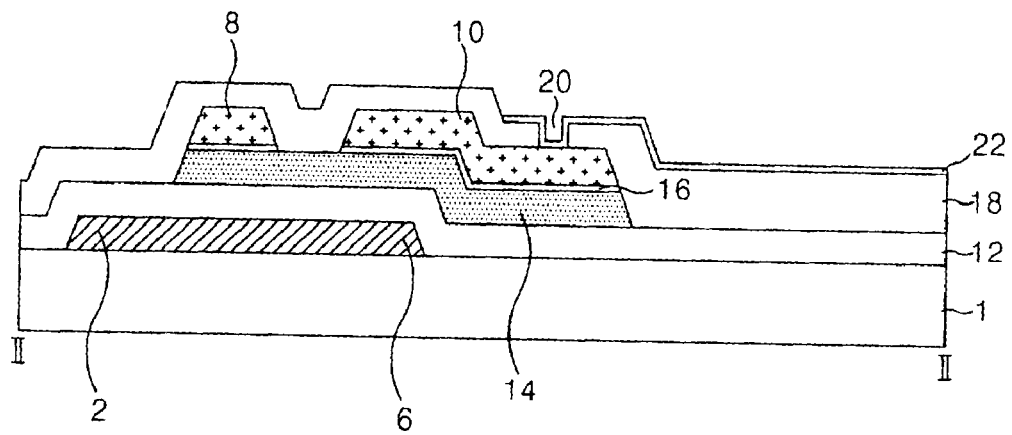
FIG. 2 is a cross-sectional view illustrating the lower substrate of the liquid crystal display device taken along line II—II of FIG. 1.
Figure 3A:
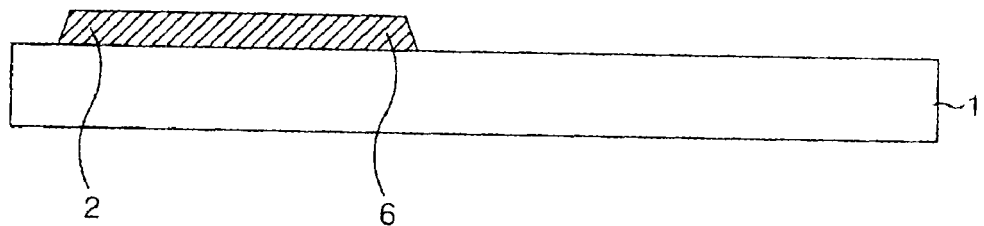
FIGS. 3A to 3D are cross-sectional views illustrating the process steps for fabricating the lower substrate of the liquid crystal display device shown in FIG. 2.
Figure 3B:
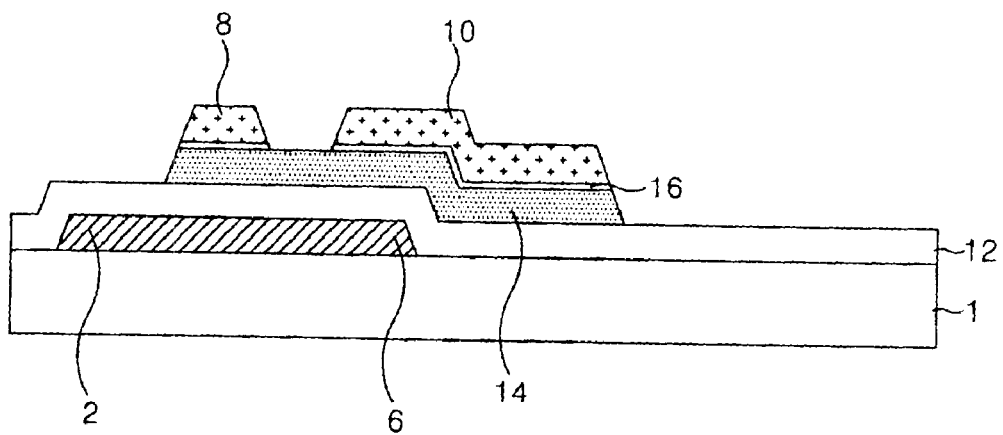
Figure 3C:
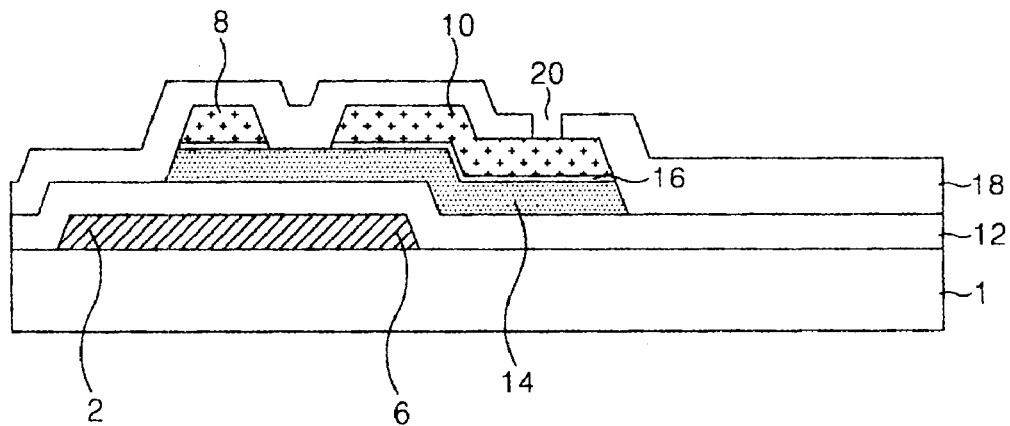
Figure 3D:
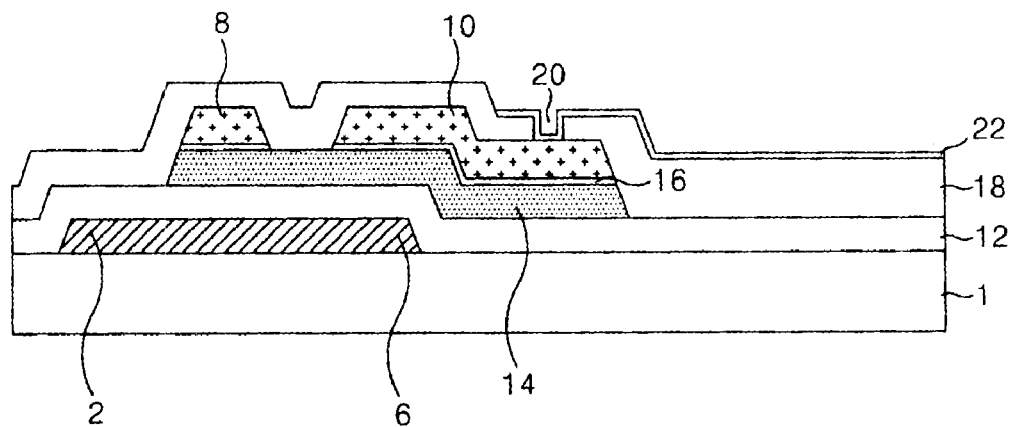
Figure 4:
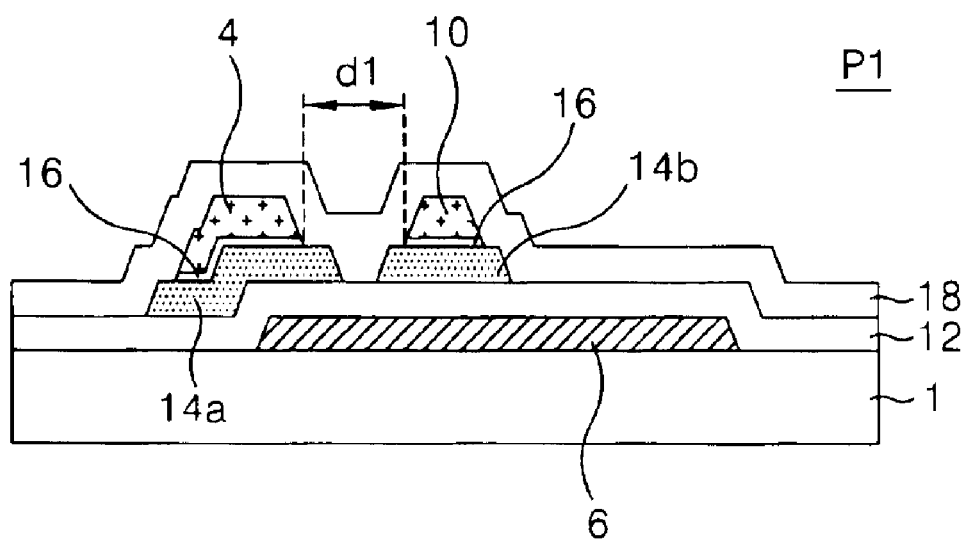
FIG. 4 is a cross-sectional view illustrating the data line and the drain electrode in P1 area shown in FIG. 1.
Figure 5:
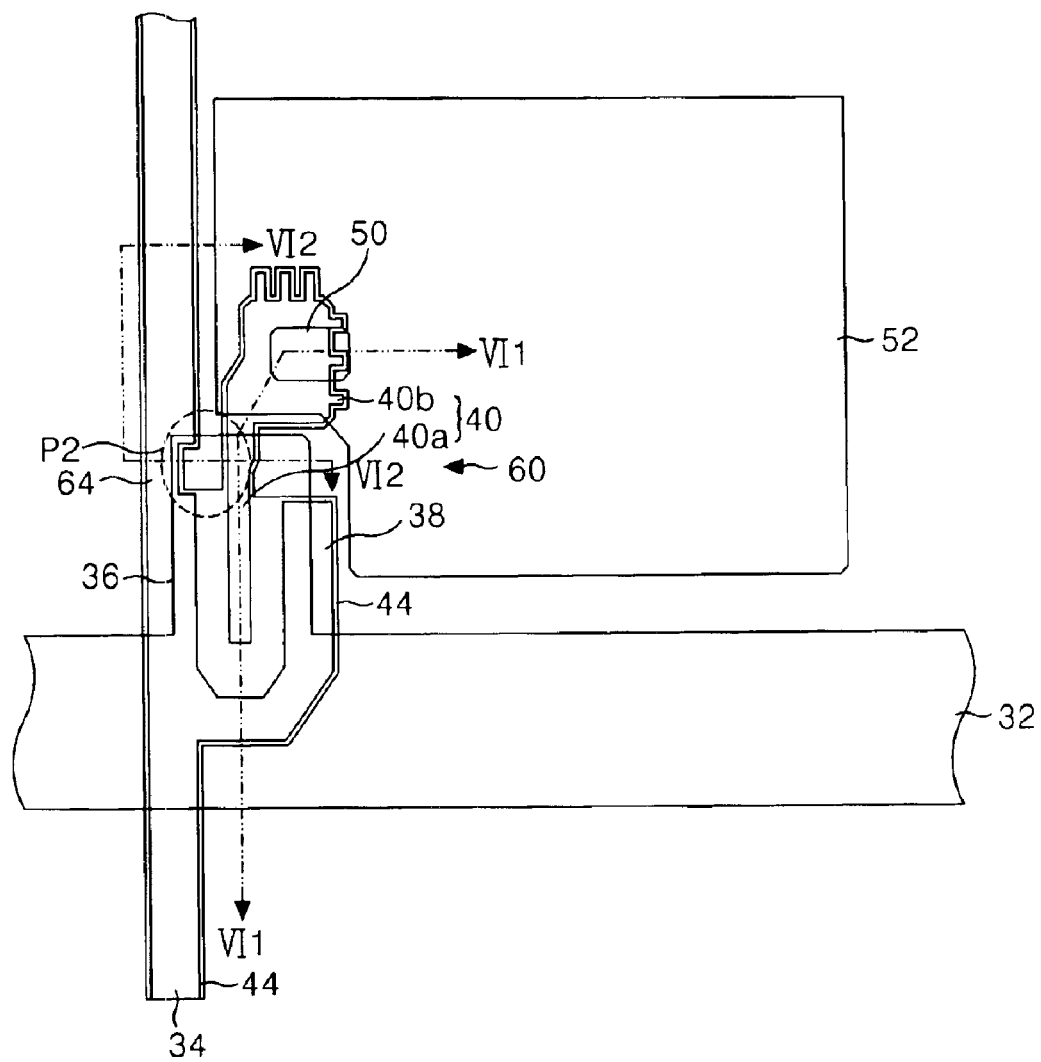
FIG. 5 is a plane view illustrating the lower substrate of a liquid crystal display device according to the present invention.
Figure 6:
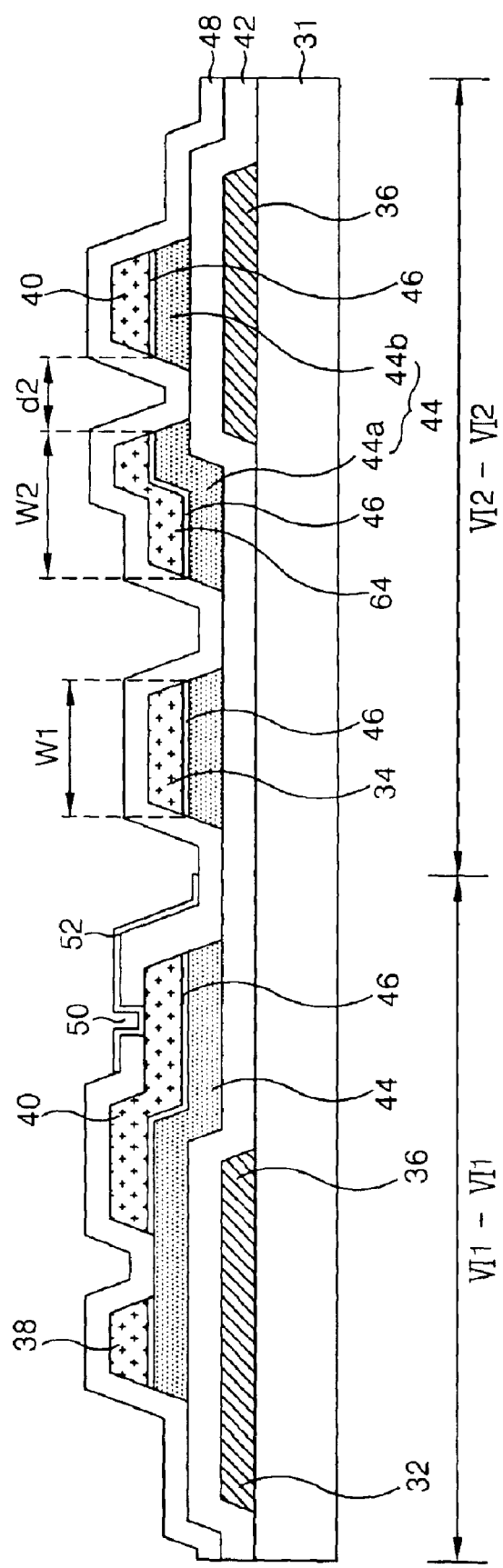
FIG. 6 is a cross-sectional view illustrating the low substrate of the liquid crystal display device taken along lines VI1—VI1 and VI2—VI2 of FIG. 5.

FIG. 5 is a plane view illustrating the lower substrate of a liquid crystal display device according to the present invention. FIG. 6 is a cross-sectional view illustrating the low substrate of the liquid crystal display device taken along lines VI1—VI1 and VI2—VI2 of FIG. 5;

Referring to both FIGS. 5 and 6, the lower substrate 31 of the liquid crystal display device according to the present invention includes a TFT 60 located at each intersection of a plurality of data lines 34 and gate lines 32, and a pixel electrode 52 connected to the drain electrode 40 of the TFT 60.

The TFT 60 includes a gate electrode 36 connected to the gate line 32, a source electrode 38 connected to the data line 34, and a drain electrode 40 connected to the pixel electrode 52.

The gate electrode 36 is projected from the gate line 32 to overlap a part of the data line 34.

The drain electrode 40 has a neck part 40a where the drain electrode 40 overlaps the gate electrode 36, and a head part 40b where the drain electrode 40 overlaps the pixel electrode 52. An end portion of the head part 40B of the drain electrode 40 is formed in a concavo-convex shape to increase an adhesion between semiconductor layers 44 and 46 and the drain electrode 40.

The source electrode 38 is formed to face into the neck part 40a of the drain electrode 40 having a U-shaped channel therebetween.

Further, the TFT 60 includes the semiconductor layers 44 and 46 to form a channel between the source electrode 38 and the drain electrode 40 by applying a gate voltage to the gate electrode 36. The TFT 60 selectively supplies a data signal from the data line 34 to the pixel electrode 52 in response to a gate signal from the gate line 32.

The pixel electrode 52 is located at a cell area divided by the data line 34 and the gate line 32 and formed of a transparent conductive material having a high light transmittance. The pixel electrode 52 is formed on a protective layer 48 and is electrically connected to the drain electrode 40. A potential difference is generated between the pixel electrode 22 and a common transparent electrode (not shown) formed in the upper substrate (not shown) by the data signal supplied through the TFT 60. The potential difference causes the liquid crystals located between the lower substrate 31 and the upper substrate (not shown) to rotate due to the dielectric constant anisotropy. The rotating liquid crystals control an amount of the light transmitted to the upper substrate through the pixel electrode 52 from the light source.

Figure 7:
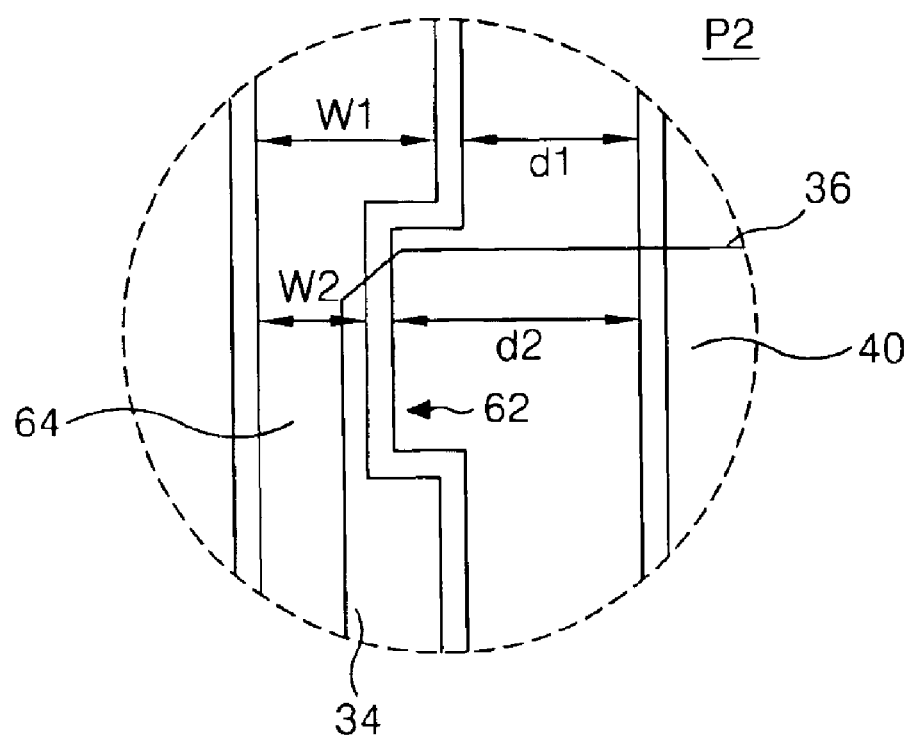
FIG. 7 is a plane view illustrating the trench of the data line in P2 area shown in FIG. 5.

The data line 34 of the liquid crystal display device according to the present invention, as shown in FIG. 7, has a trench 62 formed at an area where the data line 34 overlaps one side of the gate electrode projected from the gate line 32. A width w2 of the data line 64 having the trench 62 is narrower than a width w1 of the data line 34 without a trench. Since the width w2 of the data line 64 having the trench 62 becomes narrower, a distance d2 between the drain electrode 40 and the data line 64 having the trench 62, which face into each other, becomes wider than a distance d1 between the data line 34 and the drain electrode 10 of the related art. For instance, the width of the data line 64 having the trench 62 is about 7 to 8 micrometers ($\mu$m), the width of the data line 34 without the trench 62 is about 10 micrometers ($\mu$m). In other words, the trench 62 is formed to have a square shape with a width of about 2 to 3 micrometers ($\mu$m) in an outermost area of the data line 34. Except for this, the trench 62 can be formed in a polygonal shape such as an oval and a triangle.

In this way, because of the data line 34 having the trench 62, the distance between the data line 34 and the drain electrode 40 that are opposite to each other at one side of the gate electrode 36 becomes more distant from each other, so that a short-circuit therebetween can be prevented.

Further, due to a data active layer 44a formed to have a trench with the same pattern as the data line 64 having the trench 62, the distance between the data active layer 44a and the drain active layer 44b formed at the lower part of the drain electrode 36 becomes more distant from each other. Accordingly, a short-circuit between the data active layer 44a and the drain active layer 44b can also be prevented.

FIGS. 8A to 8D are cross-sectional views illustrating the process for fabricating the lower substrate of the liquid crystal display device shown in FIG. 6.

Figure 8A:
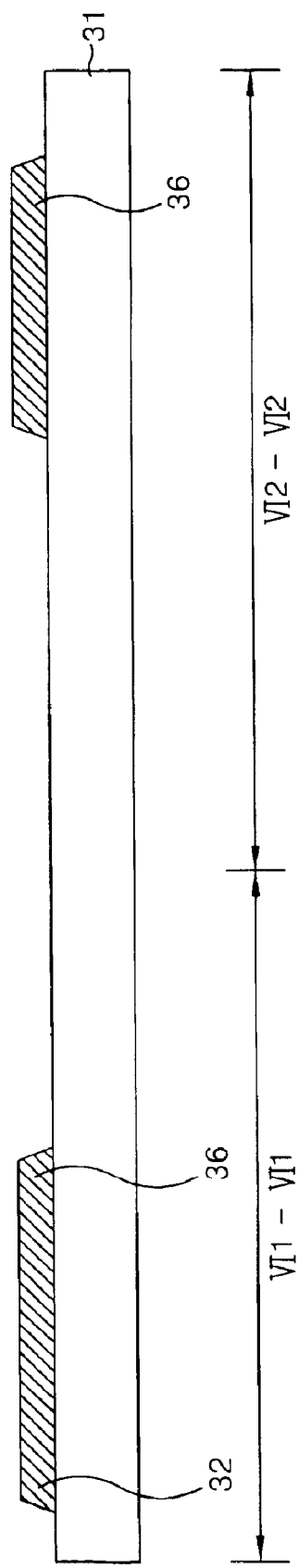

Referring to FIG. 8A, the gate electrode 36 and the gate line 32 are formed on the lower substrate 31.

To this end, a gate metal layer is deposited on the lower substrate 31 by a vapor deposition method, such as a sputtering method. The gate metal layer has a single layer structure and is formed of aluminum (Al) or aluminum neodymium (AlNd). Subsequently, a first mask (not shown) is aligned on the lower substrate 31, and then the gate metal layer is patterned by a photolithography process, including exposure and development, and an etching process. Accordingly, a gate electrode 36 and the gate line 32 are formed on the lower substrate 31.

Figure 8B:
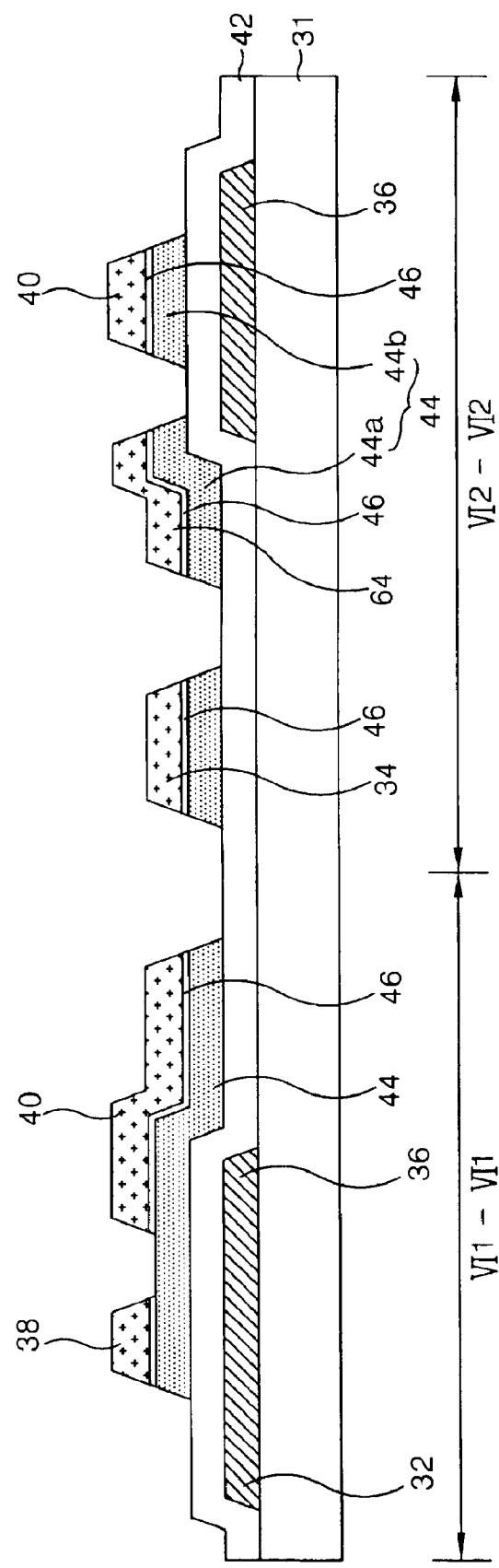

Referring to FIG. 8B, a gate insulating layer 42, an active layer 44, an ohmic contact layer 46, a data line 34, a source electrode 38, and a drain electrode 40 are formed on the lower substrate having the gate electrode 36 and the gate line 32 formed thereon.

To this end, the gate insulating layer 42, first and second semiconductor layers 45 and 47, and a data line metal layer 39 are sequentially deposited on the lower substrate 31 by a vapor deposition method, such as chemical vapor deposition (CVD) or sputtering.

The gate insulating layer 42 is formed of an inorganic insulating material, such as silicon oxide (SiOx) or silicon nitride (SiNx), a first semiconductor layer 45 is formed of undoped amorphous silicon, a second semiconductor layer 47 is formed of doped amorphous silicon, and the data line metal layer 39 is formed of molybdenum (Mo) or molybdenum alloy.

Subsequently, a second mask (not shown) is aligned on the lower substrate 31, and then the first and second semiconductor layers 45 and 47 and the data line metal layer 39 are patterned by a photolithography process, including exposure and development, and an etching process. Accordingly, an active layer 44, an ohmic contact layer 46, a data line 34, a source electrode 38, and a drain electrode 40 are formed on the lower substrate 31.

The second mask process for forming the active layer 44, the ohmic contact layer 46, the data line 34, the source electrode 38, and the drain electrode 40, will be described later.

Referring to FIG. 8C, a protective layer 48 with a drain contact hole 50 on the lower substrate 31 where the data line 34 and the source and drain electrodes 38 and 40 are formed.

To this end, the protective layer 48 is formed by depositing an insulting material on the entire surface of the lower substrate 31 where the data line 34, the source and drain electrodes 38 and 40 are formed. The protective layer 48 is formed of an inorganic insulating material, such as silicon nitride (SiNx) and silicon oxide (SiOx), or an organic insulating material such as acrylic organic compound, benzocyclobutene (BCB), and perfluorocyclobutane (PFCB).

The drain contact hole 50 is patterned by a photolithography process including exposure and development, and an etching process by using a third mask aligned on the lower substrate 31 having the protective layer 48 to be formed thereon. The drain contact hole 50 is formed in the protective layer 48 to expose the drain electrode 40.

Referring to FIG. 8D, the pixel electrode 52 is formed on the lower substrate 31 with the protective layer 48 formed thereon.

To this end, a transparent conductive material is deposited on the entire surface thereof by a vapor deposition method, such as a sputtering method. The transparent conductive material may be one of indium tin oxide (ITO), indium zinc oxide (IZO), and indium tin zinc oxide (ITZO). The transparent conductive material is patterned by a photolithography process and an etching process by using a fourth mask aligned on the lower substrate 31 to form the pixel electrode 52.

FIGS. 9A to 9D are cross-sectional views illustrating the second mask process shown in FIG. 8B.

Figure 9A:
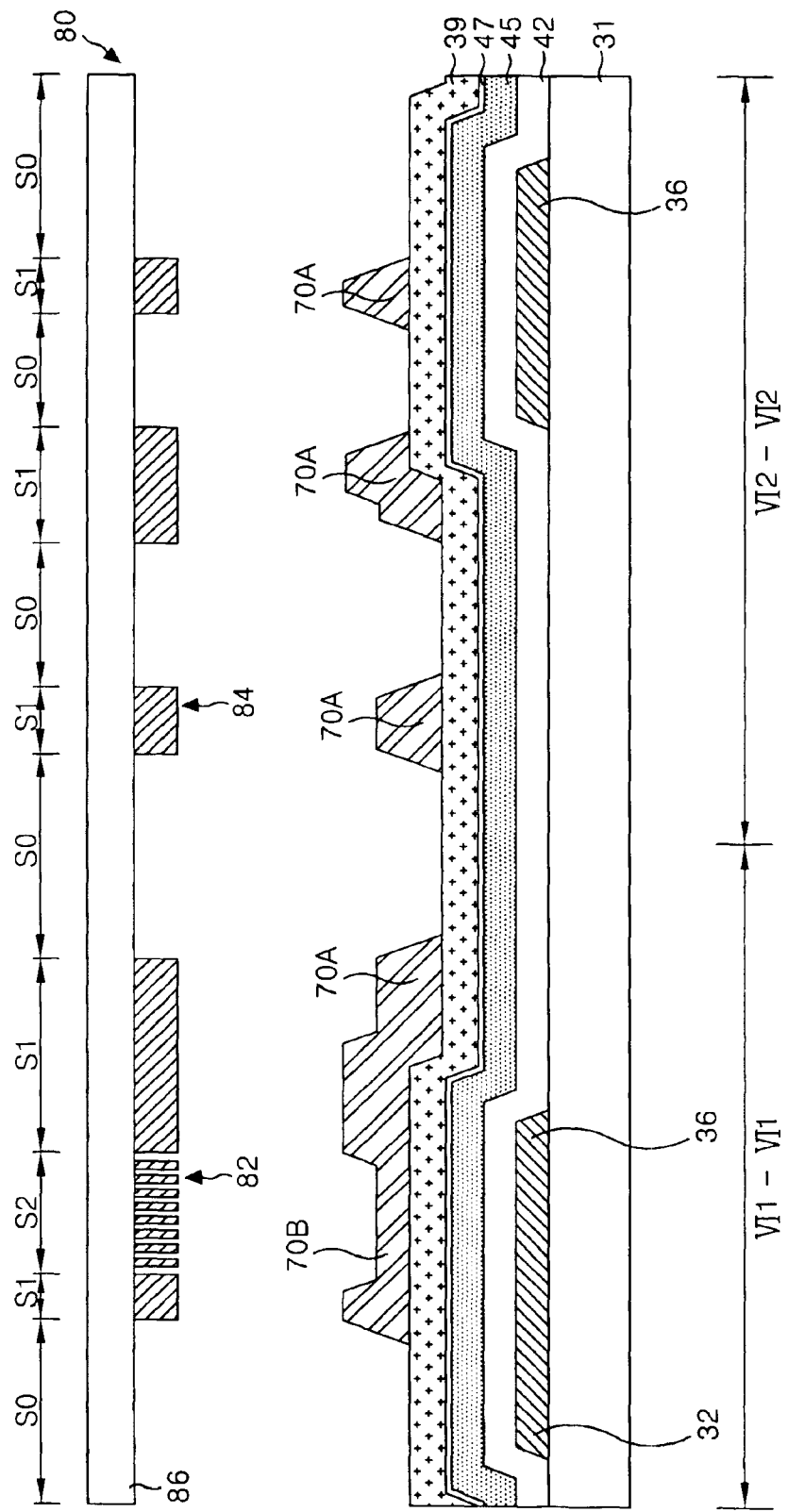

Referring to FIG. 9A, a gate insulating layer 42, first and second semiconductor layers 45 and 47, and a data line metal layer 39 are sequentially formed on the lower substrate 31 with the gate line 32 and the gate electrode 36 formed thereon. And, a photoresist is deposited on the entire surface thereof, then the second mask 80 of a half-tone mask or a diffractive mask is aligned to the lower substrate 31. Herein, the second mask 80 includes a partially transmitting layer formed at a partial exposure area S2 of a transparent mask substrate 86, and a shielding layer 84 formed at a shielding area S1. The second mask 80 is formed to expose the transparent mask substrate 86 at a full exposure area S0.

The photolithography using the second mask 80 causes the photoresist to be fully exposed across the entire exposure area S0 of the second mask 80, and a photoresist pattern 70 partially exposed or not exposed through the shielding area S1 and a partial exposure area S2 is formed. In the photoresist pattern, a first photoresist pattern 70A not exposed by the shielding layer 84 of the second mask 80 is formed to have a first height, and a second photoresist pattern 78B partially exposed by the partially transmitting layer 82 of the second mask 80 is formed to have a second height which is lower than the first height.

Figure 9B:
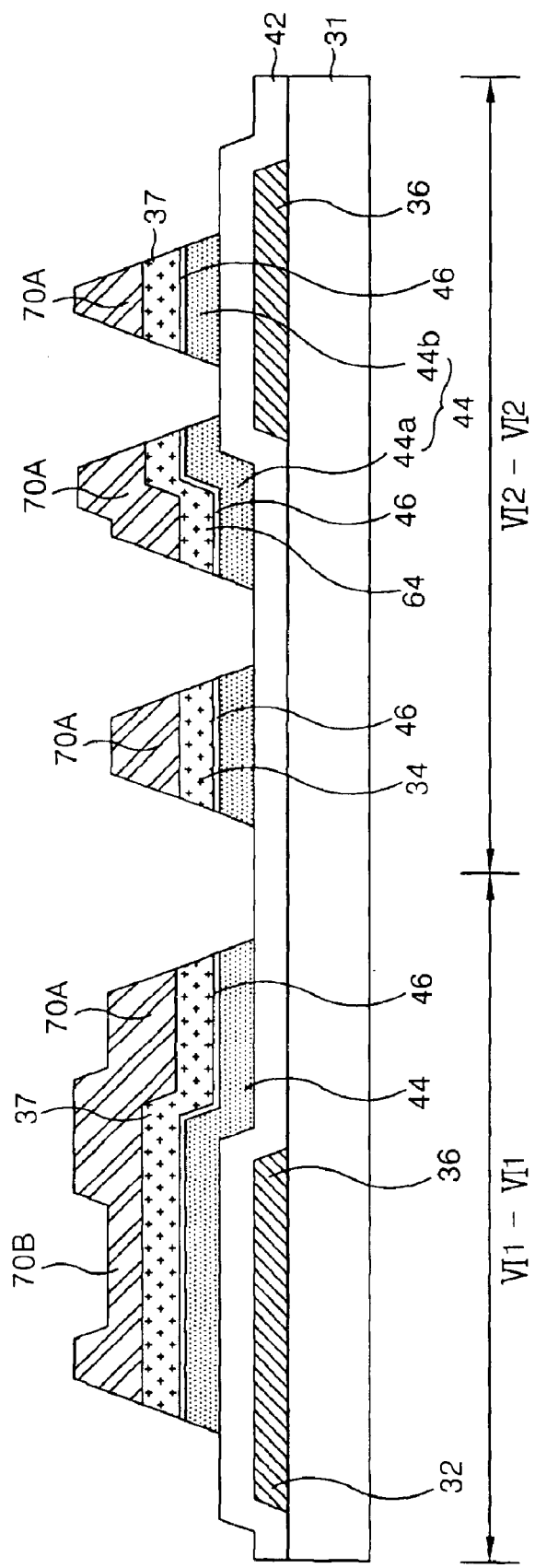

Referring to FIG. 9B, after patterning the data line metal layer 39 by a wet etching process using the photoresist pattern 70 as a mask, the first and second semiconductor layers 45 and 47 are patterned by a dry etching process. Accordingly, the active layer 44, the ohmic contact layer 46, the data lines 34 and 64, and the data line metal pattern 37 are formed to have the same pattern. Herein, the trench is formed at the area where the data line 34 overlaps the gate electrode 36, and the active layer 44 and the ohmic contact layer 46 formed at the lower portion of the data line 34 are formed to have the same pattern.

Referring to FIG. 9C, in the photoresist pattern 70, the second photoresist pattern 70B with the second height is eliminated by an ashing process by using plasma, and the first photoresist pattern 70A remains on the data lines 34 and 64 and the drain electrode with a reduced height.

Referring to FIG. 9D, the source electrode 38 and the drain electrode 40 are separately formed by eliminating a portion of the data line metal pattern 37 of the channel part of the TFT 60 by an etching process by using the photoresist pattern 70 with the second photoresist pattern removed. A channel is formed to expose the active layer 44, as shown in FIG. 8B, by using a dry etching process to remove the ohmic contact layer 46 to expose the source electrode 38 and the drain electrode 40 separated from each other by using the photoresist pattern 70.

Then, the photoresist pattern 70 remaining at the data line 34 and the source and drain electrodes 38 and 40 are eliminated by a strip process.

As described above, the liquid crystal display device and the method of fabricating the same according to the present invention forms a trench in the data line that faces into the drain electrode at an area corresponding to one side of the gate electrode. The data line having the trench causes the gap between the drain electrode and the data line to be separated apart from each other. Accordingly, a short-circuit between the data line and the drain electrode can be prevented. Further, a short-circuit can be prevented since the gap between the semiconductor layers formed at the lower part of each of the drain electrode and the data line becomes more distant from each other.

It will be apparent to those skilled in the art that various modifications and variations can be made in the liquid crystal display device and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. A liquid crystal display device, comprising:
   a gate line and a data line crossing each other on a substrate;
   a pixel electrode at an area defined by the gate line and the data line;
   a gate electrode connected to the gate line;
   a source electrode connected to the data line;
   a drain electrode connected to the pixel electrode; and
   a semiconductor layer acting as a channel between the source and drain electrode, wherein the data line and the semiconductor layer has a trench formed at a side facing to the drain electrode.

2. The liquid crystal display device according to claim 1, wherein the data line is formed to at least partially overlap the gate electrode in a vertical direction, and the trench is formed at the overlapping area of the data line and the gate electrode.

3. The liquid crystal display device according to claim 1, further comprising:
   a gate insulating layer formed on the gate electrode and the gate line; and
   a protective layer formed on the gate insulating layer.

4. The liquid crystal display device according to claim 1, wherein the data line with the trench has a width of about 7 to 8 micrometers ($\mu$m), and the data line without the trench has a width of about 10 micrometers ($\mu$m).

5. The liquid crystal display device according to claim 1, wherein the semiconductor layer comprises,
   an active layer formed over the gate electrode; and
   an ohmic contact layer formed on the active layer having the same pattern as the data line, the source electrode, and the drain electrode.

6. The liquid crystal display device according to claim 1, wherein the source electrode is formed to project from the data line, and the drain electrode is formed to face into the source electrode having a U-shaped channel therebetween.

7. A liquid crystal display device, comprising:
   a substrate;
   a gate line and a gate electrode connected to each other on the substrate;
   a first insulating layer on the gate line and the gate electrode;
   a semiconductor layer over the gate line and the gate electrode;
   a data line and a drain electrode connected to each other on the semiconductor layer, wherein the data line and the semiconductor layer has a trench at a side facing into the drain electrode; and
   a second insulating layer on the data line and the drain electrode and in the trench, so that the first and second insulating layers are in a direct contact with each other.

8. The liquid crystal display device according to claim 7, wherein the data line is formed to at least partially overlap the gate electrode in a vertical direction, and the trench is formed at the overlapping area of the data line and the gate electrode.

9. The liquid crystal display device according to claim 7, further comprising:
   a gate insulating layer formed on the gate electrode and the gate line; and
   a protective layer formed on the gate insulating layer.

10. The liquid crystal display device according to claim 7, wherein the data line with the trench has a width of about 7 to 8 micrometers ($\mu$m), and the data line without the trench has a width of about 10 micrometers ($\mu$m).

11. The liquid crystal display device according to claim 7, wherein the semiconductor layer comprises,
    an active layer formed over the gate electrode; and
    an ohmic contact layer formed on the active layer having the same pattern as the data line, the source electrode, and the drain electrode.

12. The liquid crystal display device according to claim 7, wherein the source electrode is formed to project from the data line, and the drain electrode is formed to face into the source electrode having a U-shaped channel therebetween.

* * * * *